(12) United States Patent
Allen et al.

(10) Patent No.: US 7,213,196 B2
(45) Date of Patent: May 1, 2007

(54) METHOD AND SYSTEM FOR INDEXING A DECODER

(75) Inventors: Brian L. Allen, West Melbourne, FL (US); Allen P Haar, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 416 days.

(21) Appl. No.: 10/248,644

(22) Filed: Feb. 4, 2003

(65) Prior Publication Data

US 2004/0153954 A1 Aug. 5, 2004

(51) Int. Cl.
*H03M 13/03* (2006.01)
(52) U.S. Cl. .................... 714/795; 714/796
(58) Field of Classification Search ............. 714/795, 714/796, 794
See application file for complete search history.

(56) References Cited

U.S. PATENT DOCUMENTS

| | | | | |
|---|---|---|---|---|
| 5,418,795 A | * | 5/1995 | Itakura et al. .............. 714/746 |
| 5,446,746 A | * | 8/1995 | Park ........................... 714/795 |
| 5,450,338 A | * | 9/1995 | Oota et al. .................. 708/200 |
| 5,530,707 A | * | 6/1996 | Lin ............................. 714/792 |
| 5,881,075 A | * | 3/1999 | Kong et al. ................. 714/795 |
| 6,304,612 B1 | * | 10/2001 | Baggen et al. .............. 375/262 |
| 6,415,415 B1 | * | 7/2002 | Karabed .................... 714/795 |

OTHER PUBLICATIONS

Stephen B. Wicker, Error Control Systems for Digital Communication and Storage, 1995, Prentice Hall, pp. 314-327.*

* cited by examiner

*Primary Examiner*—Albert Decady
*Assistant Examiner*—Mujtaba Chaudry
(74) *Attorney, Agent, or Firm*—Scully, Scott, Murphy & Presser, P.C.; Michael J. LeStrange, Esq.

(57) ABSTRACT

A data driven clock recovery system comprising a viterbi detector for detecting data and tentatively deciding the closest approximation, and a circuit for retrieving the tentative decision in stages. Preferably, the clock recovery system further comprises a combination series-parallel comparison circuit for selecting one value of a set of values for input to the viterbi and for applying said one value to the viterbi.

5 Claims, 3 Drawing Sheets

METHOD AND SYSTEM FOR INDEXING A DECODER

BACKGROUND OF INVENTION

This invention generally relates to data communications or processing systems, and more specifically, such systems in which the output of a decoder, such as a viterbi decoder, is used for clock or timing recovery. Even more specifically, the invention relates to procedures for indexing a decoder whose output is used for clock or timing recovery purposes.

BACKGROUND ART

In many communications systems, timing information is obtained directly from the data signal rather than by transmitting a separate synchronization signal. In these systems, it is desired that the timing loop have low latency in order to enable fast response. However, as data detection systems become more complex, more latency is introduced in the detection path. One way to maintain good decisions for the timing recovery loop, while still receiving those decisions early in a clock cycle, is to provide indexing from the detector early in the clock cycle.

In Hard Disk Drive (HDD) systems where Partial Response Maximum Likelihood (PRML) channels are used, a viterbi, or similar, detector may perform data detection, and such a detector can also provide decision feedback to the timing recovery system. Providing an early decision from a viterbi detector is complicated, however, due to the design and operation of the detector.

SUMMARY OF INVENTION

An object of this invention is to use the output of a decoder for timing or clock recovery purposes.

object of the invention is to obtain an output from a decoder with low clock cycle latency, and to use that output for timing or clock recovery purposes.

further object of the present invention is to use a mixed parallel-serial comparison to identify the proper input to MUX selection between some number of inputs for a decoder.

Another object of the invention is to compare a set of values to identify one of the values as the input to a decoder in a way that requires less time to compute than a full serial comparison approach and requires less hardware to implement than a full parallel comparison approach.

These and other objects are obtained with a data driven clock recovery system comprising a viterbi for detecting data and tentatively deciding the closest approximation, and a circuit for retrieving the tentative decision in stages. Preferably, the clock recovery system further comprises a combination series-parallel comparison circuit for selecting one value of a set of values for input to the viterbi and for applying said one value to the viterbi.

Further benefits and advantages of the invention will become apparent from a consideration of the following detailed description, given with reference to the accompanying drawings, which specify and show preferred embodiments of the invention.

DETAILED DESCRIPTION

Figure 1:
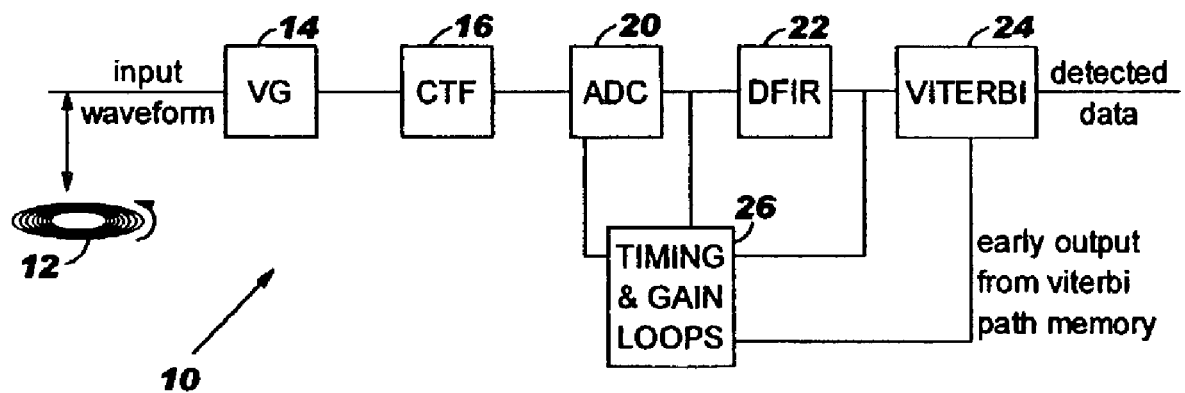
FIG. 1 generally illustrates portions of a data system employing the present invention.

FIG. 1 schematically illustrates a portion of a disc storage system 10, and more specifically, a circuit portion to read data from disc 12. During a read operation, an analog signal is read from disc 12 and transmitted to variable gain control (VG) 14, which may be used to amplify or decrease the amplitude of the signal read from disc 12. The gain controlled signal is filtered by continuous time filter (CTF) 16 and then converted to a digital signal by analog-to-digital converter (ADC) 20. The converted digital signal is filtered by a digital finite impulse response filter (DFIR) 22, and then applied to a sequence decoder such as viterbi decoder 24, which detects and outputs an estimated binary response. A timing and gain loop 26 is provided to set the VG 14 to a proper level based upon the outputs of ADC 20 and DFIR 22. Loop 26 also sets the ADC 20 sampling point to ensure proper sampling of the analog waveform. In system 10, timing information is obtained from the data signal, and it is desirable that the timing loop 26 have a low latency to enable a fast response. The timing recovery procedure can use the output of Viterbi decoder or detector 24, and one way to achieve low latency is to provide that output with low clock cycle latency. Achieving this, however, is complicated by the design and operation of the decoder.

To elaborate, a Viterbi detector is used to produce the maximum likelihood estimate of a transmitted sequence over a band limited channel with intersymbol interference. As is understood in the art, the Viterbi algorithm uses a graphical construct, referred to as a trellis, in decoding. The nodes of the trellis represent various encoder states, and these nodes are conceptually connected together by branches.

Figure 2:
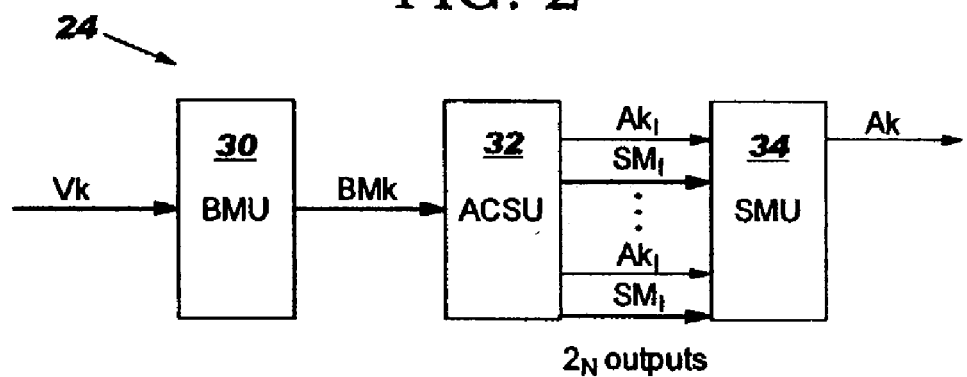
FIG. 2 shows details of a Viterbi decoder that may be used in the system of FIG. 1.

More specifically, and with reference to FIG. 2, a Viterbi detector 24 is comprised of three main units: the Branch Metric Unit (BMU) 30, the Add-Compare-Select Unit (ACSU) 32, and the Survivor Unit (SMU) 34. The BMU 30 takes sample values, which are appropriately equalized, gain adjusted and timing adjusted, from an input portion, or front end, of the system 10, and the BMU 30 uses these values to calculate branch metrics for input to the ACSU 32. The ACSU 32 then performs the add, compare and select operations needed to determine a minimum distance metric at each of the branches of the trellis and stores a state metric value for the next computation. The last function is the SMU 34, sometimes known as the path memory, which stores and updates the bit or symbol decisions from each of the states in the trellis. The SMU 34 updates the paths so that at the end of the path memory, each state has the same value (most of the time) and the memory has thus converged to a solution.

The path memory may be indexed earlier to choose a decision, but the problem is to determine which of the $2^N$ paths should be chosen. By using the value of the minimum state metric at the time instance, one may determine which of the $2^N$ paths is the best path to choose at that point in time.

To find the minimum state metric, one must compare $2^N$ M-bit values for the state metrics and find the minimum. One way of performing this comparison is to compare two values at a time and retain the minimum value, which is then compared with the next state metric. This is continued until all $2^N$ state metrics have been compared and a minimum value is found. However, this is a serial approach and takes $2^N-1$ compares and $2^N-1$ clock cycles (assuming a compare takes one cycle) to perform. For a sixteen state trellis, this operation thus requires fifteen compares and fifteen clock cycles. In many cases, this delay defeats the purpose of selecting an early decision.

Figure 3:
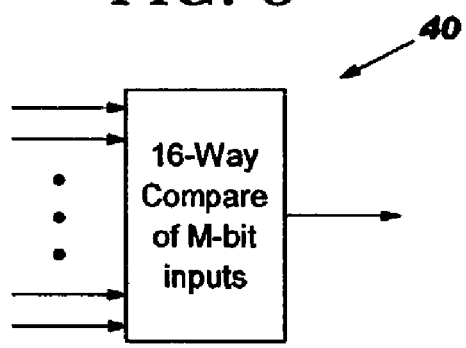
FIG. 3 depicts a fully parallel comparison approach for identifying the minimum of sixteen values.

Another option is to compare all $2^N$ state metrics in a parallel fashion to provide the minimum state metric and best path decision in one clock cycle. This approach requires $(2^N)^2/2-(2^N)/2$ comparisons, which for the sixteen state example is 120 comparisons. This fully parallel approach, represented in FIG. 3 at 40, thus requires more hardware than the serial approach, but only takes one cycle to perform. The problem is that as the number of states becomes large, the number of comparisons becomes prohibitive.

Figure 4:
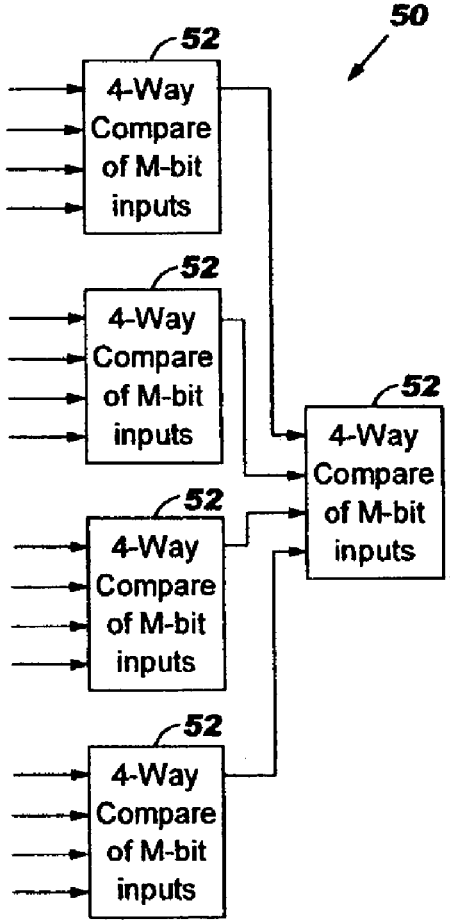
FIG. 4 illustrates a mixed parallel-serial comparison approach for identifying the minimum of sixteen values.

The present invention provides a mixed parallel-serial comparison to obtain the answer in a reasonable time with reasonable hardware requirements. For the sixteen state trellis, the comparison may be broken down into groups of four-way comparisons that achieve the same result as the sixteen-way compare, but in two clock cycles and fewer comparisons. FIG. 4 illustrates how this can be done.

Figure 5:
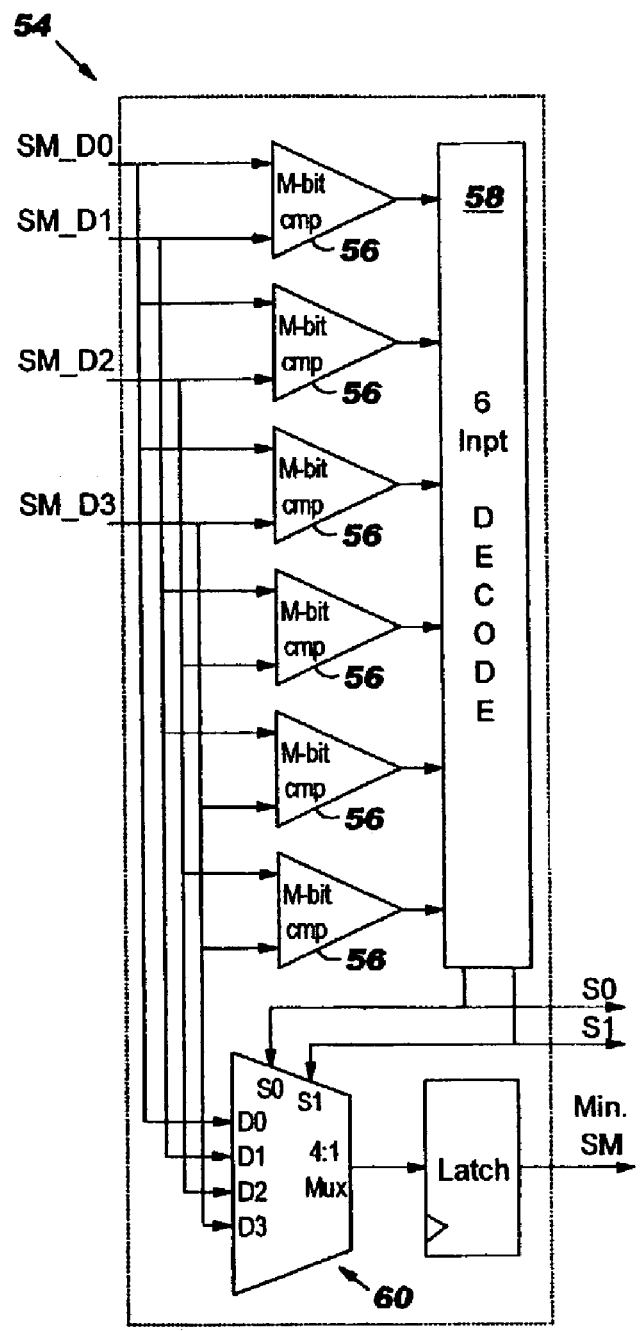
FIG. 5 is a more detailed view of one of the four-way compares shown in FIG. 4.

This parallel-serial compare 50 uses five four-way compares 52 to find the minimum of sixteen state metrics. A four-way compare is performed by comparing each input to all other inputs and then decoding the result. As illustrated in FIG. 5, a four-way compare 54 is accomplished by six two-way comparison 56 and a six input decode circuit 58 to select the minimum value.

This comparison operation, at 60, also feeds forward a signal or value identifying which group of four input it was comparing so that this information may be retained for the final comparison, where the minimum of all sixteen state metrics is determined. This parallel-serial implementation can also be used on larger size trellis where the advantage is even more drastic. Table I, below, illustrates: N, the number of states in the trellis, the number of two-way compares required for a fully parallel implementation, the number of two-way compares required when basing the parallel-serial implementation of a four-way compare, and the associated number of clock cycles required to perform the parallel-serial implementation with four-way compares.

TABLE I

| N | $2^N$ States | Compares (parallel) | 4-way => 2 way Compares | Delays (4 ways) |
|---|---|---|---|---|
| 1 | 2 | 1 | .5 => 1 | 1 |
| 2 | 4 | 6 | 1 => 6 | 1 |
| 3 | 8 | 28 | 2.5 => 13 | 2 |
| 6 | 16 | 120 | 5 => 30 | 2 |
| 5 | 32 | 496 | 10.5 => 61 | 3 |
| 6 | 64 | 2016 | 21 => 126 | 3 |
| 7 | 128 | 8128 | 48.5 => 289 | 4 |
| 8 | 256 | 32640 | 85 => 510 | 4 |

Figure 6:
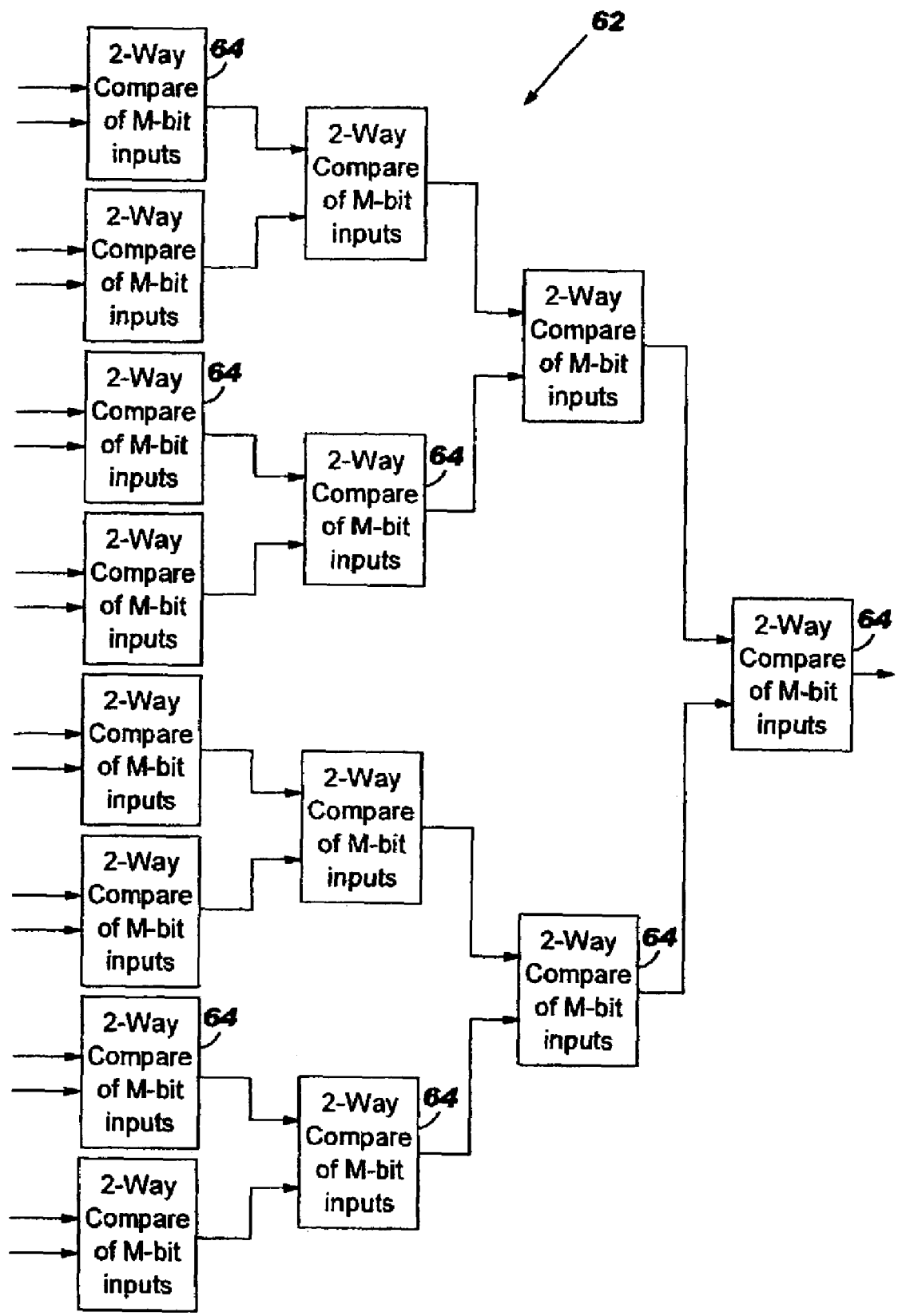
FIG. 6 shows an alternate mixed parallel-serial comparison approach that uses two-way compares to identify the minimum of sixteen values.

It is easy to see that as the number of states increases, the number of two-way compares becomes prohibitive for the fully parallel implementation but remain reasonable for the parallel-serial implementation with some minimal number of additional clock cycles. For example, the parallel-serial implementation may use two, three, four, or more clock cycles. The advantage of the present invention is less hardware to perform the same function. Another embodiment of the parallel-serial comparison, illustrated at 62 in FIG. 6, is built with two-way compares 64 for a sixteen state trellis.

Just as the four-way parallel-serial implementation is capable of saving hardware, the two-way parallel-serial implementation also does this. The two-way parallel-serial implementation requires less comparison hardware to implement the same function as the four-way parallel-serial implementation, but has the trade-off that the delay required for the output is greater. A comparison of the number of compares required for the fully parallel vs. the two-way parallel-serial embodiment is shown in table II.

TABLE II

| N | $2^N$ States | Compares (parallel) | 2-way => 2 way Compares | Delays (2 ways) |
|---|---|---|---|---|
| 1 | 2 | 1 | 1 => 1 | 1 |
| 2 | 4 | 6 | 3 => 3 | 2 |
| 3 | 8 | 28 | 7 => 7 | 3 |
| 4 | 16 | 120 | 15 => 15 | 4 |
| 5 | 32 | 496 | 31 => 31 | 5 |
| 6 | 64 | 2016 | 63 => 63 | 6 |
| 7 | 128 | 8128 | 127 => 127 | 7 |
| 8 | 256 | 32640 | 255 => 255 | 8 |

The delay required for the two-way parallel-serial implementation can also be compared with that of the four way parallel-serial implementation, to trade off hardware for delay. The m-way parallel-serial embodiment was illustrated for m=2 and m=4, but can be done for other integer values of m based upon the desired tradeoff between the delay before the answer is available and the required hardware.

When it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

The invention claimed is:

1. A data driven clock recovery system comprising:
   a Viterbi detector for detecting data and tentatively deciding the closest approximation; and
   a timing loop for performing a timing recovery procedure;
   a circuit for retrieving the tentative decision in stages; and
   a combination series and parallel comparison circuit for selecting one value of a set of values for input to the Viterbi detector and for applying said one value to the Viterbi detector, said combination series and parallel comparison circuit comprising:
   (i) a first portion for processing said set of values in parallel to select a group of said values; and
   (ii) a second circuit portion, in series with said first circuit portion, for receiving said group of values from said first circuit portion, for selecting said one value from said group, and for applying said one value to the Viterbi detector; and
   a means for applying said selected one value from the Viterbi decoder to the timing loop for timing recovery.

2. A clock recovery system according to claim 1, wherein:
   said first circuit portion includes a plurality of first comparators, each of the first comparators comparing an associated subset of the set of values according to a preset rule to identify one value of said subset; and said second circuit portion includes at least one second comparator to compare the values identified by the first comparators according to a predetermined rule to select one of the identified values.

3. A clock recovery system according to claim 2, wherein:
the first comparators operate in parallel in the same, first clock cycle to identify said identified values of said subsets; and
the second comparator operates in a second clock cycle, following the first clock cycle, to select said selected value.

4. A clock recovery system according to claim 2, wherein each of the first comparators identifies the minimum value of the associated subset of values.

5. A clock recovery system according to claim 4, wherein each of the first comparators sends to the second comparator a signal identifying the subset of values compared by said each first comparator.

* * * * *